(12) United States Patent
Chang et al.

(10) Patent No.: US 9,385,065 B2
(45) Date of Patent: Jul. 5, 2016

(54) SOLID STATE THERMAL RECTIFIER (75) Inventors: Chih-Wei Chang, Berkeley, CA (US);
Arunava Majumdar, Orinda, CA (US);
Alexander K. Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 1602 days.

(21) Appl. No.: 12/444,149

(22) PCT Filed: Oct. 2, 2007

(86) PCT No.: PCT/US2007/080230
§ 371 (c)(1),
(2), (4) Date: Mar. 17, 2010

(87) PCT Pub. No.: WO2008/042920
PCT Pub. Date: Apr. 10, 2008

(65) Prior Publication Data
US 2010/0167004 A1    Jul. 1, 2010

Related U.S. Application Data (60) Provisional application No. 60/827,868, filed on Oct. 2, 2006.

(51) Int. Cl.
*B32B 9/00* (2006.01)
*H01L 23/373* (2006.01)
*C01B 31/02* (2006.01)
*F28F 13/00* (2006.01)
*F28F 21/02* (2006.01)
(Continued)

(52) U.S. Cl.
CPC .......... *H01L 23/373* (2013.01); *C01B 31/0293* (2013.01); *F28F 13/00* (2013.01); *F28F 21/02* (2013.01); *B82Y 10/00* (2013.01); *B82Y 30/00* (2013.01); *F28F 2013/008* (2013.01); *H01L 2924/0002* (2013.01); *Y10T 428/24091* (2015.01); *Y10T 428/30* (2015.01)

(58) Field of Classification Search
CPC .............. C01B 31/022; C01B 31/0293; C01B 2202/00
USPC ........... 428/408; 264/29.1; 165/185; 977/742
See application file for complete search history.

(56) References Cited

U.S. PATENT DOCUMENTS 6,407,922 B1 * 6/2002 Eckblad et al. ............... 361/704
6,660,959 B2   12/2003 Vallance et al.
(Continued)

OTHER PUBLICATIONS

Tang et al., "A novel precursor for synthesis of pure boron nitride nanotubes," Chemical Communication, vol. 12, pp. 1290-1291, (2002).

(Continued)

*Primary Examiner* — Daniel H Miller
(74) *Attorney, Agent, or Firm* — Lawrence Berkeley National Laboratory (57) ABSTRACT

Thermal rectifiers using linear nanostructures as core thermal conductors have been fabricated. A high mass density material is added preferentially to one end of the nanostructures to produce an axially non-uniform mass distribution. The resulting nanoscale system conducts heat asymmetrically with greatest heat flow in the direction of decreasing mass density. Thermal rectification has been demonstrated for linear nanostructures that are electrical insulators, such as boron nitride nanotubes, and for nanostructures that are conductive, such as carbon nanotubes.

20 Claims, 6 Drawing Sheets

(51) Int. Cl.
*B82Y 10/00* (2011.01)
*B82Y 30/00* (2011.01)

(56) References Cited

U.S. PATENT DOCUMENTS 6,709,566 B2 3/2004 Cumings et al.
6,972,056 B1 12/2005 Delzeit et al.
7,011,884 B1 3/2006 Chow et al.
2004/0026629 A1* 2/2004 Fujieda et al. ............ 250/423 R
2005/0224220 A1 10/2005 Li et al.
2005/0230270 A1 10/2005 Ren et al.
2006/0073332 A1* 4/2006 Huang et al. .................. 428/367

OTHER PUBLICATIONS

Chang et al., Science, vol. 314, 1121 (Nov. 17, 2006).
Written Opinion for International Application No. PCT/US07/80230 mailed Mar. 25, 2008.

* cited by examiner

SOLID STATE THERMAL RECTIFIER

CROSS-REFERENCE TO RELATED APPLICATIONS

This application claims priority to U.S. Provisional Patent Application 60/827,868, filed Oct. 2, 2006, which is incorporated by reference herein.

STATEMENT OF GOVERNMENTAL SUPPORT

The invention described and claimed herein was made in part utilizing funds supplied by the U.S. Department of Energy under Contract No. DE-AC02-05CH11231. The U.S. Government has certain rights in this invention.

TECHNICAL FIELD

This invention relates generally to linear nanostructures for thermal rectification and to methods for forming such thermally rectifying nanostructures.

BACKGROUND ART

Non-linear solid-state devices that control electrical conduction, such as diodes and transistors, marked the emergence of modern electronics. Counterpart devices for heat conduction would have important implications for thermal circuits, thermal management, and the field of phononics in general. Linear nanostructures have very high intrinsic thermal conductance, but they normally display no thermal rectification effects, i.e., they conduct heat along the central linear axis equally well in both directions. In recent years, theoretical proposals for thermal rectifiers have been put forward, but these involve complex coupling between individual atoms and substrates, which are difficult to construct as actual devices.

Asymmetric thermal conduction has been achieved by using a mechanical switch, but this "brute force" method is impractical for most applications. It would be highly desirable to have a simple, solid state, asymmetric thermal conduction device as the thermal analog of the solid state electrical diode.

DISCLOSURE OF INVENTION AND BEST MODE FOR CARRYING OUT THE INVENTION

Thermal management is relevant to a variety of fields. It is a problem in integrated electronic circuit design, where heat is an unwanted byproduct of circuit operation. Yet heat phonons, like electrons and photons, are information carriers, and it would be useful to be able to make use of such information. Historically, in order to make use of thermal signals, it has been necessary to convert them into electronic voltages as soon as they are detected. For example, far-infrared superconducting bolometers operated at cryogenic temperatures utilize the abrupt resistance change at the superconducting transition temperature to convert thermal signals to electronic voltage. The voltage information is carried by conduction electrons through metal wires. Metal wires are good thermal conductors at low temperature, and thermal shielding is difficult. Thermal rectifiers, such as those described herein, could provide good thermal shielding and, at the same time, transmit thermal signals or phonons for processing without first converting the phonons to electrical signals. The processed phonon signals could be collected and converted into electronic signals at higher temperature regions away from the cryogenic area where thermal shielding is a less important issue. Thus thermal rectifiers would make it possible to process thermal currents independently, and convert them into electronic signals with greater efficiency.

When nonlinear thermal control is available, phonons will no longer be considered useless waste products, but will become another means of transmitting information. Current flowing through fast electronic devices generate heat. The heat is considered a nuisance as it can degrade the functioning of the electronic devices. Much effort has been made to get rid of this so-called "waste heat." With thermal rectifiers as described herein, it is possible to design additional thermal channels onto electronic devices. The thermal channels can carry heat phonons, which themselves carry additional circuit information, away from the electronics in a controlled way. Thus the heat generated by electronic devices can be used as yet more information to be processed, rather than just waste.

The terms "thermal management," "phonon management," and "heat management" are used herein interchangeably to mean controlling how heat or phonons travel. This is analogous to "electron management" in integrated circuits.

The term "linear nanostructure" is used herein to mean a nanostructure that has one dimension that is extremely large in comparison to the other two and is therefore a quasi-one-dimensional structure. Some examples of linear nanostructures include nanotubes, nanowires, and nanorods. Both single wall and multiwall structures are included in the meaning of linear nanostructure. Although the embodiments of the invention are discussed using examples with carbon nanotubes (CNTs) and boron nitride nanotubes (BNNTs), the term "linear nanostructure" is meant to include any material that can form such a structure. In addition, the terms "nanotube," "nanowire," and "nanorod" can be used interchangeably to mean any linear nanostructure.

The term "thermal rectifier" is used herein to mean a linear structure that conducts heat along its central (long) axis differently in each direction. Such a structure exhibits asymmetric thermal conduction along its central axis, serving as a thermal analog to a solid state electrical diode.

The term "linear density gradient" is used herein to mean a linear material mass density that changes as a function of position along the central axis of the nanostructure. The change can be continuous or discontinuous, linear or nonlinear. Linear material density can be expressed, for example, in milligrams per nanometer.

The term "benign environment" is used herein to mean an environment that causes no noticeable deleterious effects on the thermal rectification properties of thermal rectifiers. Examples of benign environments include air, vacuum, non-reactive liquids, and non-reactive solids.

The term "mass loading" is used herein to mean the process of adding material to a linear nanostructure. Material can be added to a nanostructure, for example, by evaporative deposition, electron beam deposition, electrochemical methods, electro-plating, and/or by self assembly.

Nanotubes are nearly one-dimensional and thus they are ideal materials for thermal rectification. Previous studies with carbon and boron nitride nanotubes (CNTs, BNNTs) have demonstrated that the thermal conductivity of these one-dimensional structures is high and is dominated by phonons. For BNNTs, the thermal conductance is due entirely to phonons. For unmodified nanotubes with a uniform linear mass distribution (i.e., no significant linear density gradient), the thermal conductance is symmetric, i.e. independent of the axial direction of heat flow.

Figure 1:
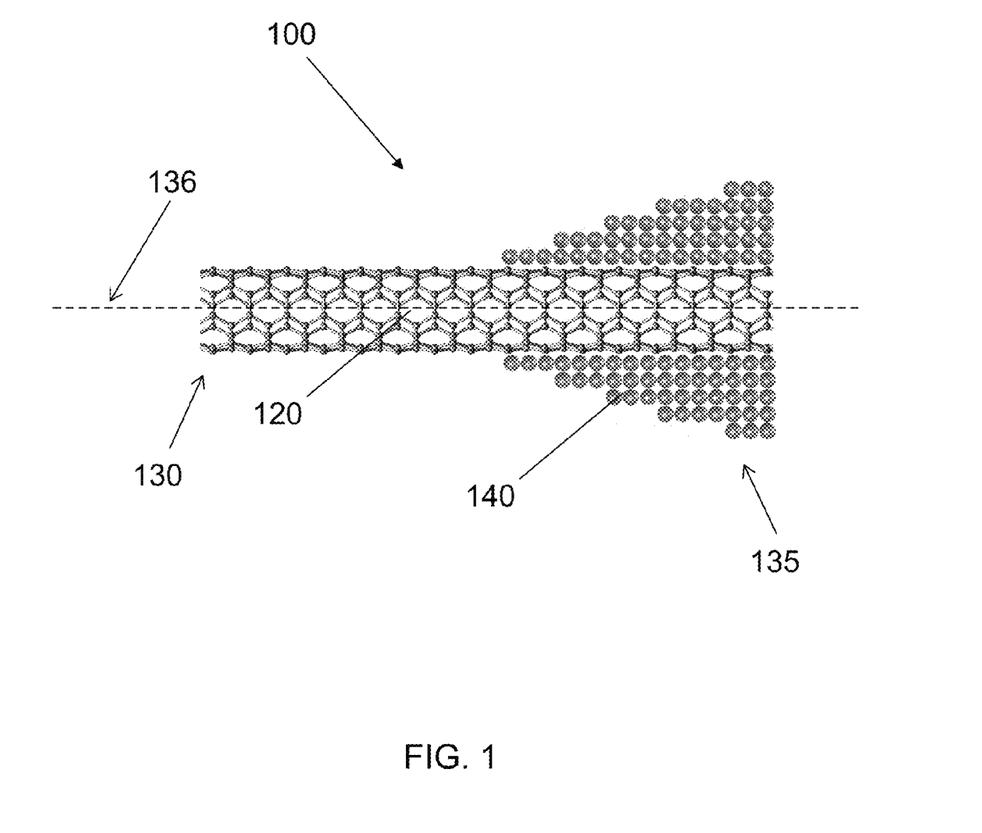
FIG. 1 is a schematic drawing of a modified linear nanostructure that exhibits thermal rectification.

Surprisingly, it has been found that linear nanostructures that have a linear density gradient exhibit asymmetric thermal conductance. In one exemplary embodiment, CNTs and BNNTs have been modified to have a non-uniform mass distribution along their long axes. Material is added preferentially to one end of a nanostructure to produce the desired mass distribution, i.e., a linear mass density gradient along the long axis between one end region of the linear nanostructure and the other. In one arrangement, the material that is added preferentially to one end of the nanostructure has a higher mass density than the linear nanostructure. In another arrangement, the material that is added preferentially to one end of the nanostructure has the same mass density as the linear nanostructure. In another arrangement, the material that is added preferentially to one end of the nanostructure is the same material as the linear nanostructure. In another arrangement, the material that is added preferentially to one end of the nanostructure has a lower mass density than the linear nanostructure. FIG. 1 shows an example of such a modified nanostructure 100 as viewed perpendicular to a long axis 136 of a linear nanostructure 120. The linear nanostructure 120 has no additional material attached to it at a first end region 130. At second end region 135, there are atoms of an additional material 140 in contact with the linear nanostructure 120. The amount of the additional material 140, and thus the linear density of the modified structure 100, increases along the axis 136 of the linear nanostructure 120 in moving from the first end 130 to the second end 135. The additional material 140 at the second end region 135 at least partially covers the linear nanostructure in the second end region 135. The additional material 140 may be continuous as shown in FIG. 1 or may be discontinuous, as shown below in FIG. 5. Any arrangement of additional material that results in a linear mass gradient is included within the embodiments of the invention.

In an exemplary embodiment, pristine multiwall BNNTs were synthesized using an adaptation of a previously reported method (C. Tang, Y. Bando, T. Sato, K. Kurashima, *Chem. Commun.*, 1290 (2002), yielding samples having an outer diameter of approximately 30-40 nm and a length of approximately 10 μm. In another exemplary embodiment, high quality CNTs with diameters ranging from approximately 10 nm to 33 nm were prepared using conventional arc methods. Linear nanostructures with a wide variety of dimensions and made of a wide variety of materials are included within the embodiments of the invention. The thermal rectification effects observed are not dependent on the lengths, diameters, and number of walls for the linear nanostructures used.

In an exemplary embodiment as shown in FIG. 2a, an individual carbon nanotube 220 is placed on a custom designed microscale thermal conductivity test fixture 202 using a piezo-driven manipulator (not shown) operated inside a scanning electron microscope (SEM). The test fixture 202 incorporates independently suspended heat source and sink pads 250a, 250b with integrated Pt film resistors. The pads 250a, 250b can serve symmetrically as heater and heat sink pairs, the role of each depending on the direction electrical current is driven through the test fixture 202. The temperatures of the pads 250a, 250b are determined from changes in electrical resistance.

The CNT 220 is bonded onto the pads 250a, 250b and suspended in space 260 between them. For thermal conductance measurements, a known power (P) is supplied to the heater 250a (or 250b), while resistance changes of the heater 250a and heat sink 250b (or vice versa) are used to determine the resulting temperature changes of the heater 250a and sink 250b pads, $\Delta T_h$ and $\Delta T_s$, respectively. The thermal conductance (K) of the nanotube is determined from $\Delta T_h$ and $\Delta T_s$ using the relation:

$$K = \frac{P}{\Delta T_h - \Delta T_s}\left(\frac{\Delta T_s}{\Delta T_h + \Delta T_s}\right) \quad (1)$$

Because of unavoidable non-uniformities in the construction of the test fixture 202 itself, the system with pristine nanotube 220 attached is first calibrated to establish residual thermal asymmetry by switching the roles of the heater and the sink. FIG. 2b is a low magnification transmission electron microscopy (TEM) image of the CNT 220 in FIG. 2a.

The linear density of the CNT 220 is modified in-situ on the test fixture 202 in the SEM. Trimethyl cyclopentadienyl platinum ($C_9H_{16}Pt$) is deposited non-uniformly along the length of the nanotube 220 to effect a mass density gradient along the linear axis between first end 230 and second end 235 of the nanotube 220. FIG. 2(c) is a TEM image of the modified CNT 220' after the mass loading, i.e., the $C_9H_{16}Pt$ deposition. The volume of the modified CNT 220' at the second end 235 has clearly been enhanced relative to the volume at the first end 230. The mass loading is even greater than FIG. 2(c) suggests, as the molecular weight of $C_9H_{16}Pt$ (about 319 g/mole) is much larger than that of the unaltered carbon nanotube $(C\text{---}C)_5$ molecular weight (about 120 g/mole). (Note that for BNNTs, the molecular weight of $(BN)_5$ is also about 120 g/mole). Thus even for comparable molecular volumes, the mass density of $C_9H_{16}Pt$ is significantly higher.

After mass loading, the thermal conductance of the modified nanotube 220' is measured in both directions. Thermal rectification of the nanotube is defined as:

$$\text{Rectification} = \frac{K_{H \to L} - K_{L \to H}}{K_{L \to H}} \times 100\% \quad (2)$$

where $K_{L \to H}$ is the nanotube thermal conductance for heat flowing from a region having low linear mass density to a region having high linear mass density (e.g., from the first end 230 to the second end 235 in FIG. 2c), and $K_{H \to L}$ is the nanotube thermal conductance for heat flowing from a region having high linear mass density to a region having low linear mass density (e.g., from the second end 235 to the first end 230 in FIG. 2c). For the modified CNT 220' of FIG. 2c, thermal rectification at room temperature is measured as approximately 2%. The direction of highest heat flow is from the second end 235 to the first end 230, i.e. in the direction of decreasing linear mass density.

Figure 2:
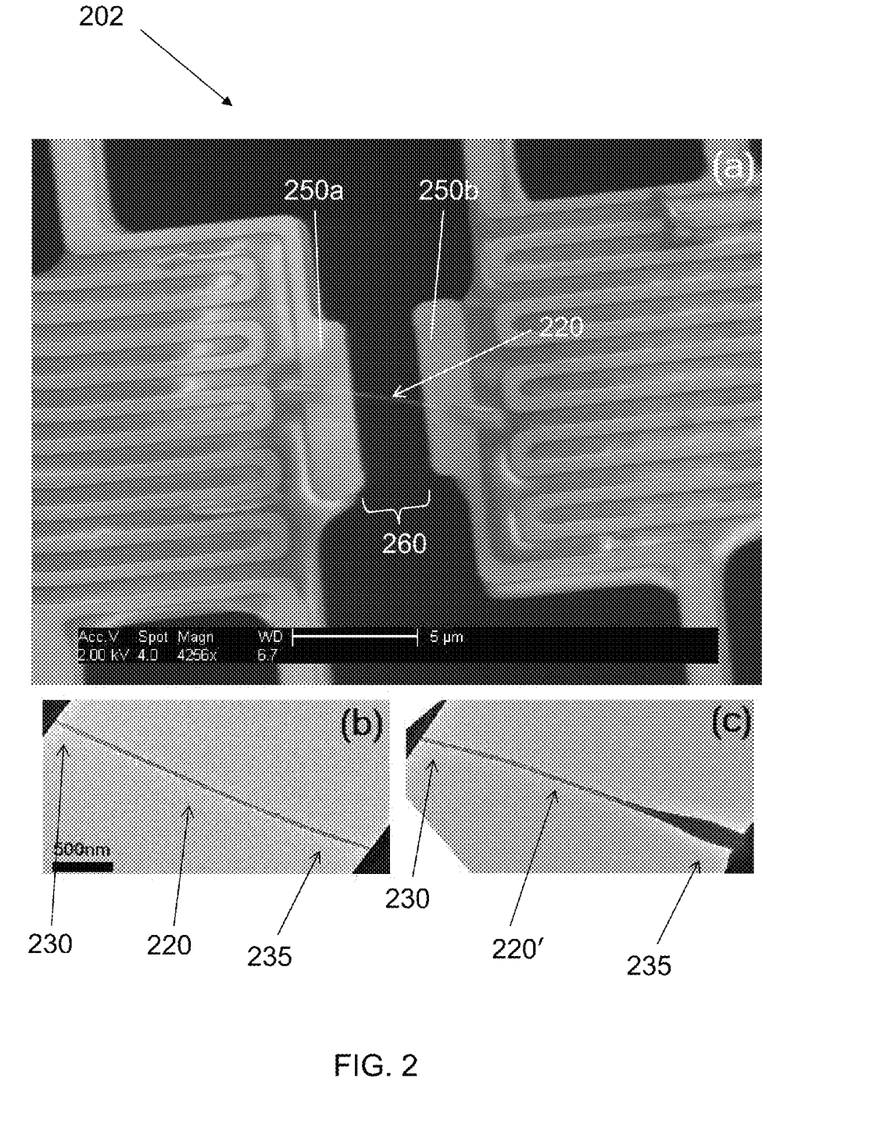

In another embodiment, three BNNTs shown in FIGS. 3a, 3b, 3c are mass-engineered with $C_9H_{16}Pt$, as has been discussed for the CNT in FIG. 2 above. The thermal rectifications are found to be 7%, 4%, and 3% for the BNNTs in FIGS. 3a, 3b, 3c, respectively. The arrows in FIGS. 3a, 3b, 3c indicate the direction of heat flow in which the highest thermal conductance is observed. All measurements show consistently that highest thermal conductance occurs when heat flows from a high mass region (where most $C_9H_{16}Pt$ is deposited) to a low mass region. It is known that electrons do not contribute to thermal transport in BNNTs, so the observed rectification effects can be attributed to non-electronic excitations.

FIG. 3(d) is a graph that shows the relation between $\Delta T_h$ (temperature change of the heater pad) and $\Delta T_s$ (temperature change of the heat sink pad) for the BNNT of FIG. 3(a) both before and after depositing $C_9H_{16}Pt$. The solid lines are best fit slopes which intersect the origin. For clarity, only data over limited $\Delta T_h$, $\Delta T_s$ ranges is shown; data of similar quality were obtained over much wider ranges of $\Delta T_h$ and $\Delta T_s$. The slope of the $\Delta T_h$ vs. $\Delta T_s$ curve is proportional to absolute thermal conductance K (see Equation (1)). As expected, $K_{L \to H}$ and $K_{H \to L}$ of the pristine nanotube are the same. After mass-loading, $K_{H \to L}$ and $K_{L \to H}$ differ by 7%, well above the uncertainty of the measurement, which is approximately 1%.

Other ways in which depositing $C_9H_{16}Pt$ on a linear nanostructure might affect the thermal conductance of the nanostructure were considered.

A test was performed to determine whether thermal rectification might be caused by the fused $C_9H_{16}Pt$ providing an additional thermal conductance channel on the linear nanostructure. It would be expected that this would affect the thermal conductance of the linear nanostructure symmetrically. A thin wire of fused $C_9H_{16}Pt$ was suspended across the test fixture pads shown in FIG. 2a and its thermal conductance, K, was measured. The K value for $C_9H_{16}Pt$ was found to be less than 1% of the K value of (carbon or boron nitride) nanotubes and hence its direct thermal contribution is negligible.

Figure 3:
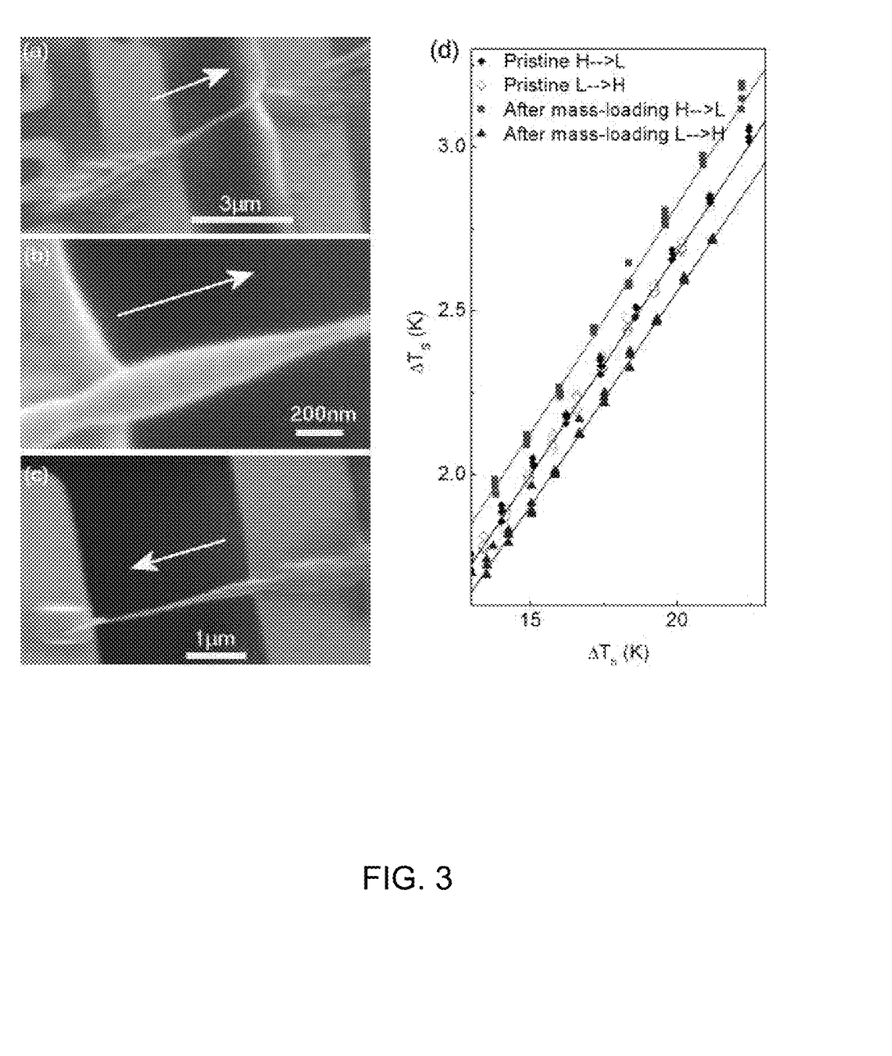
FIGS. 3a, 3b, 3c are SEM images of three different boron nitride nanotubes (BNNTs) after depositing $C_9H_{16}Pt$.
FIG. 3d shows plots of the change in temperature at the heat sink ($\Delta T_s$) as a function of the change in temperature at the heat source ($\Delta T_h$) for the BNNT of FIG. 3(a) before and after depositing $C_9H_{16}Pt$.

It was also considered whether the asymmetric geometrical shape of the composite nanostructure introduces asymmetric boundary scattering of phonons, which might cause the thermal conductance to be reduced in one direction and increased in the other direction. But it would be expected that thermal conductance is higher when heat flows from a narrow region to a thick region. Using the definition of Equation (2), this would lead to negative rectification. The thermal rectification measured for the nanostructures in FIGS. 2 and 3 is positive. Any effect due to asymmetric shape is not dominant.

Figure 4:
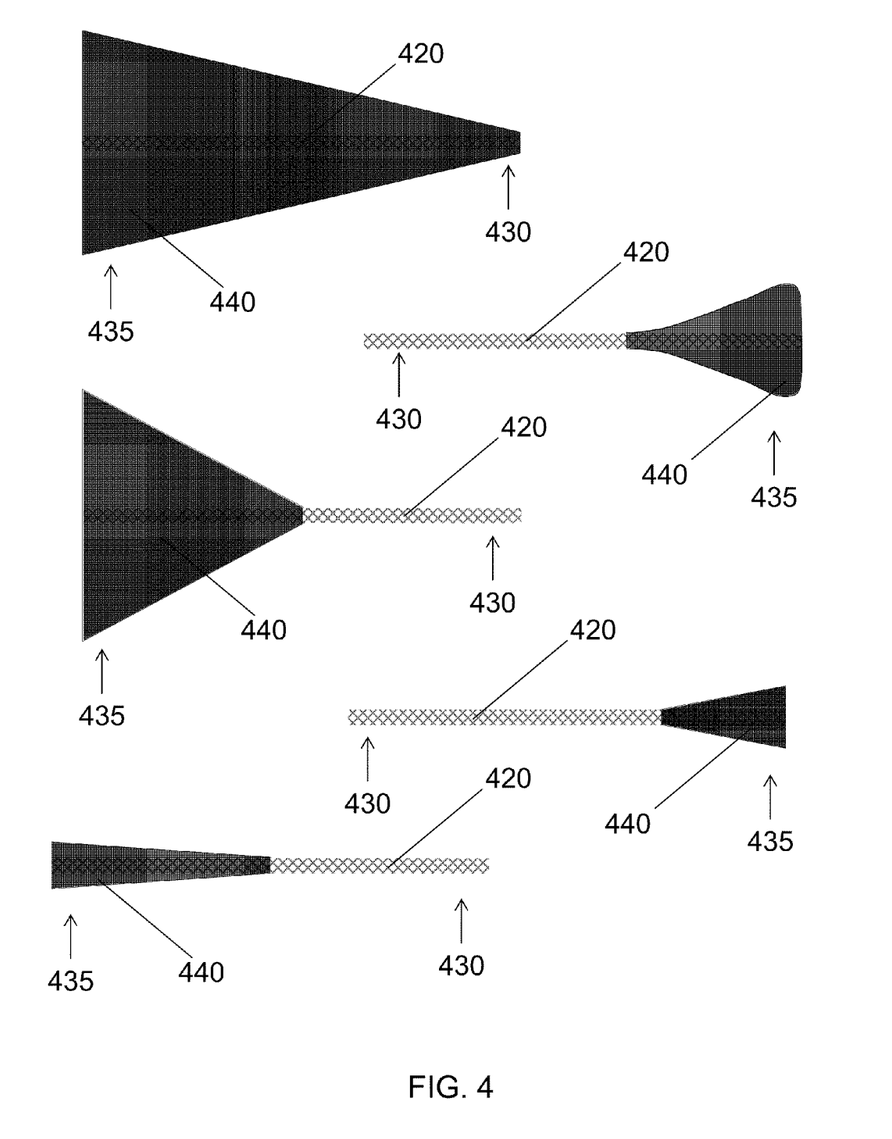
FIG. 4 is a series of schematic drawings that show a variety of exemplary embodiments of the invention.
Figure 5:
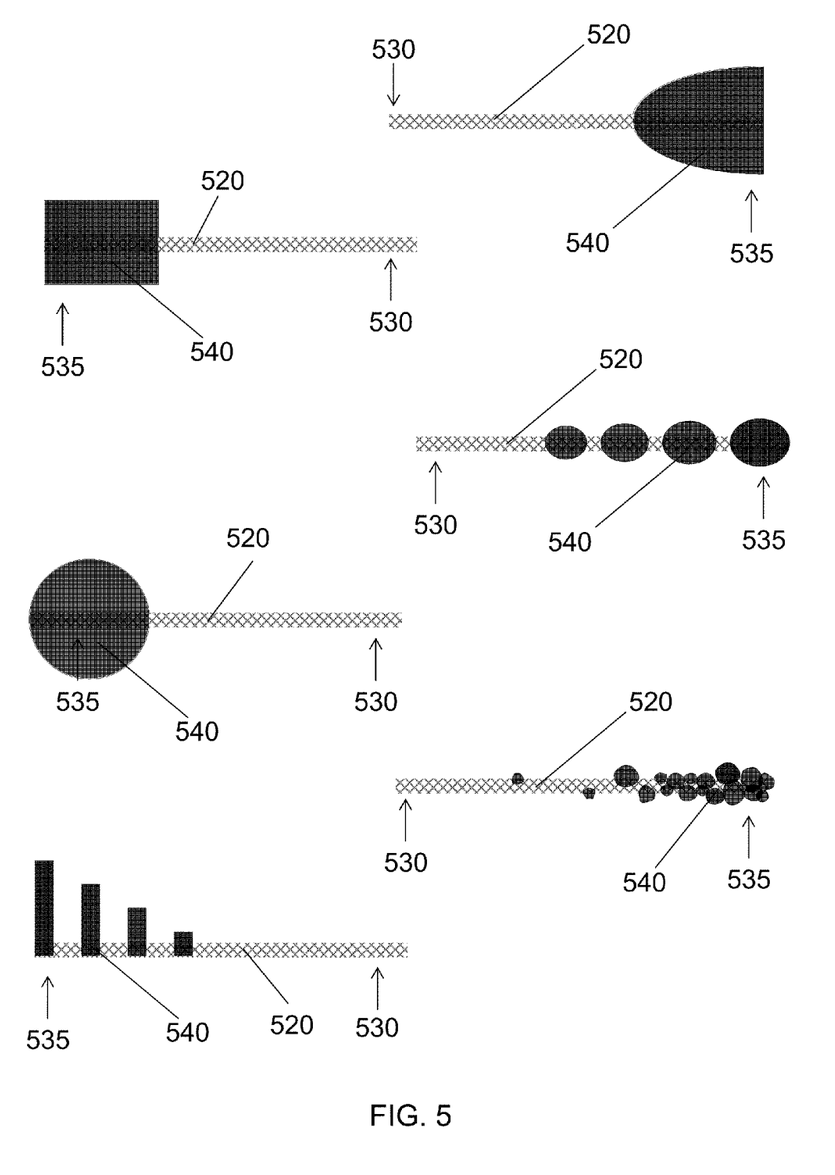
FIG. 5 is a series of schematic drawings that show a variety of exemplary embodiments of the invention.

Exemplary embodiments of linear nanostructure thermal rectifiers are shown in FIGS. 4 and 5. The rectifiers are modified linear nanostructures. The linear nanostructures 420, 520 are made from materials that are capable of forming linear nanostructures. Additional material 440, 540 is added preferentially to one end region of the linear nanostructures 420, 520. In some arrangements the additional material 440, 540 is different from the material that forms the linear nanostructures. In some arrangements, the additional material 440, 540 has a higher atomic (molecular) weight and/or a higher material density than the linear nanostructure material. After the additional material 440, 540 is deposited, there is a linear density gradient along the axis of the modified linear nanostructures 420, 520, with the highest density in the end regions 435, 535 to which the additional material 440, 540 is added and the lowest density in the end regions 430, 530. In some arrangements, the linear density gradient is continuous. In other arrangements, the linear density gradient is not continuous.

Figure 6A:
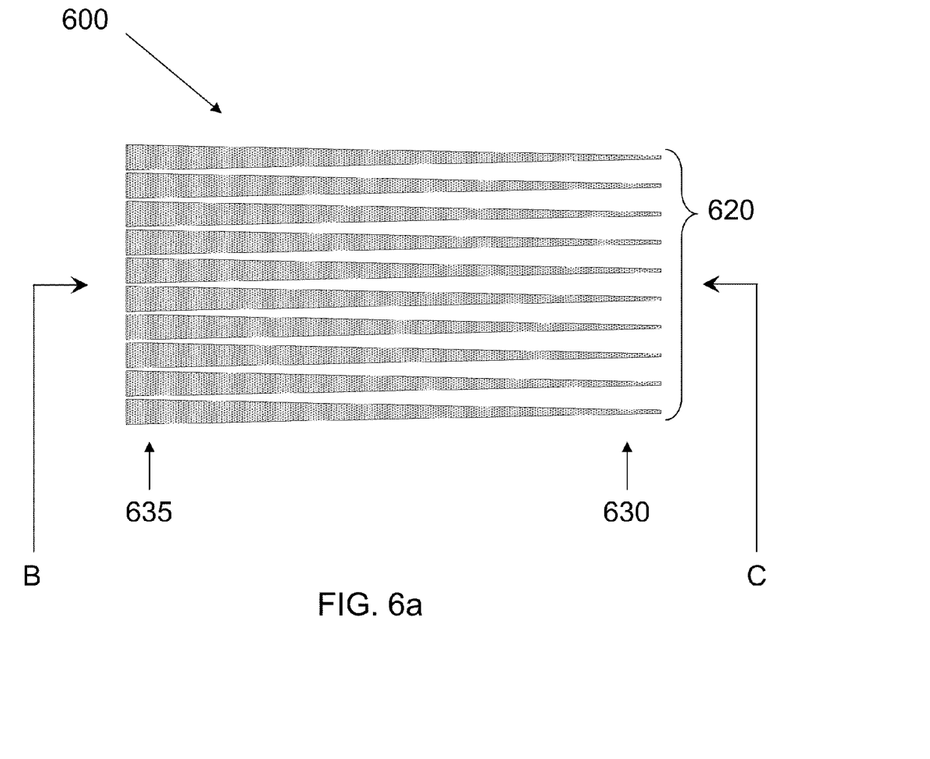
FIG. 6 shows schematic drawings of an array of linear nanostructure thermal rectifiers according to an embodiment of the invention.
Figure 6B:
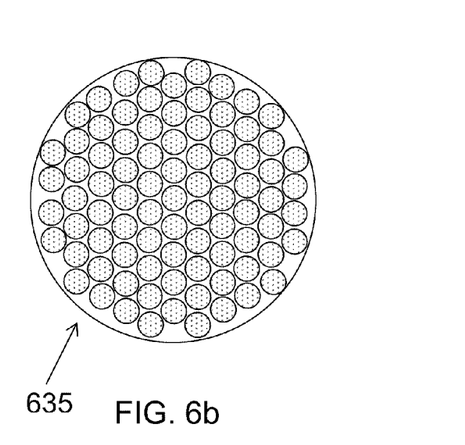
Figure 6C:
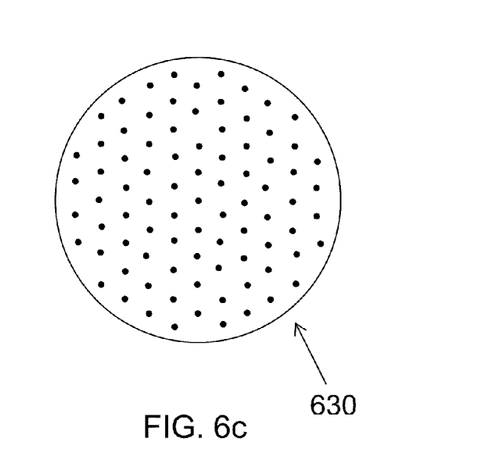

In one embodiment of the invention, linear nanostructure thermal rectifiers are arranged in an array, 600 as shown in the schematic drawing of FIG. 6a. Modified linear nanostructures 620 are arranged approximately parallel with like ends together as shown in the sectional view of FIG. 6a. Nanostructure end regions 635 are modified with additional material. There is a decreasing linear density gradient along the long axes of the nanostructures from the end regions 635 to end regions 630. FIG. 6b shows a view of the nanostructure array as seen looking along direction B in FIG. 6a, that is, looking at the most modified ends of the nanostructures. FIG. 6c shows a view of the nanostructure array as seen looking along direction C in FIG. 6a, that is, looking at the least modified (or unmodified) ends 635 of the nanostructures. Such arrays can be made using any number of linear nanostructures so as to provide thermal rectification on a macroscopic scale.

In some arrangements, an array of nanostructure thermal rectifiers can be surrounded by benign environments that have no deleterious effects on the thermal rectification properties of the linear nanostructures. Examples of such environments include air, vacuum, non-reactive liquids and non-reactive soldis. In some arrangements, the arrays can be embedded in liquid material that provides a benign environment for the linear nanostructures. Examples of such liquid materials include water, alcohol, and polymer gels. In some arrangements, the arrays can be embedded in solid material that provides a benign environment for the linear nanostructures. Examples of such solid materials include plastics, ceramics, glasses, cellulose, and composite materials. Such arrays can be built into the walls of refrigerators or buildings, for example, to provide "smart" insulation. In some arrangements, the arrays can surround biological cells and provide thermal shielding from environmental heat bursts.

This invention has been described herein in considerable detail to provide those skilled in the art with information relevant to apply the novel principles and to construct and use such specialized components as are required. However, it is to be understood that the invention can be carried out by different equipment, materials and devices, and that various modifications, both as to the equipment and operating procedures, can be accomplished without departing from the scope of the invention itself.

BRIEF DESCRIPTION OF THE DRAWINGS

FIG. 2a is a scanning electron microscope (SEM) image of a carbon nanotube (CNT) connected to electrodes on a test fixture. FIG. 2b is a corresponding low magnification transmission electron microscope (TEM) image of the CNT shown in FIG. 2a. FIG. 2c is a TEM image of the same CNT after asymmetric deposition of $C_9H_{16}Pt$.

INDUSTRIAL APPLICABILITY

Solid state nanoscale thermal rectifiers have many applications, from nanoscale electro-thermal circuits to solar energy collection to thermal regulation in biological cells and in hybrid biological/inorganic systems to macroscale energy efficient buildings and appliances, such as refrigerators. With nonlinear thermal control available, phonons will no longer be considered unwanted by-products of electronics. Phonons, like electrons and photons, are information carriers, and can be processed accordingly. Historically, semiconductor- or superconductor-based devices have been employed to access thermal signals as soon as they are generated. Thermal rectifiers make it possible to process thermal currents independently, and convert them into electronic signals efficiently.

But more complex applications are also possible. A thermal rectifier is a thermal analog to an electronic diode. In an electronic diode, the directional flow of charge carriers is restricted. A diode allows electric current to flow in one direction, but blocks it in the opposite direction. Thus, the diode can be thought of as an electronic version of a check valve. Circuits that require current flow in only one direction typically include one or more diodes in the circuit design. A thermal rectifier allows heat to flow preferentially in one direction, but retards the flow in the opposite direction. Thus, the thermal rectifier can be thought of as a thermal version of a check valve. Heat circuits designed with one or more thermal rectifiers can allow heat phonon flow in only one direction (or preferentially in one direction). A person of ordinary skill in the art can imagine other ways in which thermal rectifiers can be arranged in thermal circuits analogous to electronic circuits. One example is to attach two thermal rectifiers with the ends having the lowest mass density together, so that the direction of greatest heat flow is toward the junction of the two thermal rectifiers. Another example is to attach two thermal rectifiers with the ends having the highest mass density together, so that the direction of greatest heat flow is away from the junction of the two thermal rectifiers. Additional device elements could be included at the junction to allow for further processing of the phonon signals, as for example, to do computation.

We claim:

1. A thermal rectifier, comprising:
a single linear nanostructure comprising a first material, the linear nanostructure having a first end region and a second end region; and
a second material disposed on the linear nanostructure, the second material having a greater mass density that the first material, a mass density of the linear nanostructure and the second material disposed thereon increasing from the first end region to the second end region, the thermal rectifier having a thermal conductance along an axis of the linear nanostructure that is asymmetric, the thermal rectifier being a nanoscale device.

2. The thermal rectifier of claim 1 wherein the linear nanostructure is selected from a group consisting of nanotubes, nanowires, and nanorods.

3. The thermal rectifier of claim 1 wherein the first end region is free of the second material.

4. The thermal rectifier of claim 1 wherein the second material is disposed at least partially on the first end region of the linear nanostructure.

5. The thermal rectifier of claim 1 wherein the mass density increases linearly from the first end region to the second end region.

6. The thermal rectifier of claim 1 wherein the mass density increases non-linearly from the first end region to the second end region.

7. The thermal rectifier of claim 1 wherein the mass density increases discontinuously from the first end region to the second end region.

8. The thermal rectifier of claim 1 wherein the first end region does not have the second material disposed thereon.

9. The thermal rectifier of claim 1 wherein the linear nanostructure comprises a nanotube, and wherein the nanotube comprises carbon or boron nitride.

10. The thermal rectifier of claim 1 wherein the mass density increases continuously from the first end region to the second end region.

11. The thermal rectifier of claim 1 wherein a volume of the second material disposed on the linear nanostructure increases from the first end region to the second end region.

12. The thermal rectifier of claim 1 wherein the thermal conductance from the second end region to the first end region is larger than the thermal conductance from the first end region to the second end region.

13. The thermal rectifier of claim 1 wherein the linear nanostructure comprises a nanostructure selected from a group consisting of a carbon nanostructure and a boron nanostructure, and wherein the second material comprises trimethyl cyclopentadienyl platinum ($C_9H_{16}Pt$).

14. A thermal rectifier, consisting of:
a single linear nanostructure comprising a first material, the linear nanostructure having a first end region and a second end region; and
a second material disposed on the linear nanostructure, a mass density of the linear nanostructure and the second material disposed thereon increasing from the first end region to the second end region, the thermal rectifier having a thermal conductance along an axis of the linear nanostructure that is asymmetric.

15. The thermal rectifier of claim 14 wherein the thermal conductance from the second end region to the first end region is larger than the thermal conductance from the first end region to the second end region.

16. A thermal rectifier, comprising:
a linear nanostructure comprising a first material, the linear nanostructure having a first end region and a second end region, the linear nanostructure comprising a nanotube selected from a group consisting of a carbon nanotube and a boron nitride nanotube; and
a second material disposed on the linear nanostructure, the second material comprising trimethyl cyclopentadienyl platinum ($C_9H_{16}Pt$), a mass density of the linear nanostructure and the second material disposed thereon increasing from the first end region to the second end region, the thermal rectifier having a thermal conductance along an axis of the linear nanostructure that is asymmetric.

17. The thermal rectifier of claim 16 wherein the thermal conductance from the second end region to the first end region is larger than the thermal conductance from the first end region to the second end region.

18. The thermal rectifier of claim 14 wherein the first end region is free of the second material.

19. The thermal rectifier of claim 14 wherein the mass density increases linearly from the first end region to the second end region.

20. The thermal rectifier of claim 14 wherein the mass density increases continuously from the first end region to the second end region.

* * * * *